US012609687B2

(12) United States Patent
Srivastava et al.

(10) Patent No.: US 12,609,687 B2
(45) Date of Patent: Apr. 21, 2026

(54) INTEGRATED CIRCUIT WITH SHMOO DELAY CIRCUIT

(71) Applicant: NXP USA, Inc., Austin, TX (US)

(72) Inventors: Neha Srivastava, Delhi (IN); Kumar Abhishek, Bee Cave, TX (US); Nishant Kumar, Noida (IN)

(73) Assignee: NXP USA, Inc., Austin, TX (US)

( * ) Notice: Subject to any disclaimer, the term of this patent is extended or adjusted under 35 U.S.C. 154(b) by 92 days.

(21) Appl. No.: 18/429,773

(22) Filed: Feb. 1, 2024

(65) Prior Publication Data

US 2025/0030410 A1    Jan. 23, 2025

(30) Foreign Application Priority Data

Jul. 19, 2023    (IN) .............................. 202311048689

(51) Int. Cl.
*H03K 5/133*         (2014.01)
*H03K 5/135*         (2006.01)
*H03K 5/00*          (2006.01)

(52) U.S. Cl.
CPC ............. *H03K 5/133* (2013.01); *H03K 5/135* (2013.01); *H03K 2005/00058* (2013.01)

(58) Field of Classification Search
CPC ................... H03K 5/133; H03K 5/135; H03K 2005/00058; H03K 2005/00019; H03K 3/013; H03K 3/011; H03K 5/13; H03K 5/14; H03K 2005/00065; H03K 2005/00071; H03K 2005/00026; H03K 3/014; H03K 5/131
See application file for complete search history.

(56) References Cited

U.S. PATENT DOCUMENTS

| | | | |
|---|---|---|---|
| 6,377,101 B1 | 4/2002 | Eto et al. | |
| 7,039,147 B2 | 5/2006 | Donnelly et al. | |
| 7,447,620 B2 | 11/2008 | Hidvegi et al. | |
| 2002/0053933 A1 | 5/2002 | Takahashi | |
| 2004/0225977 A1 | 11/2004 | Akkerman | |
| 2005/0238127 A1 | 10/2005 | Naffziger et al. | |
| 2009/0013214 A1 | 1/2009 | Liu et al. | |
| 2009/0138837 A1 | 5/2009 | Baumgartner et al. | |
| 2010/0115482 A1 | 5/2010 | DiLullo et al. | |
| 2016/0344577 A1 | 11/2016 | Leibowitz et al. | |
| 2022/0209759 A1* | 6/2022 | Srivastava ............. H03K 5/135 |

FOREIGN PATENT DOCUMENTS

CN           112260686 A       1/2021

* cited by examiner

*Primary Examiner* — Jung Kim
(74) *Attorney, Agent, or Firm* — Joanna G. Geld

(57)          ABSTRACT

A first circuit path communicates a first, asynchronous, signal, and a second path communicates a second signal. A schmoo delay circuit receives the first and second signals and includes shmoo control circuitry and a delay generator. The delay generator receives a delay selector signal from the shmoo control circuitry indicative of an amount of delay. The shmoo delay circuit provides a delayed version of at least one of the first or second signals. A first logic circuit receives the delayed version of the at least one of the first signal or the second signal, and a second logic circuit receives another one of the first signal or the second signal. The shmoo control circuitry modifies the delay selector signal to sweep through a set of different delay amounts applied by the delay generator to generate delayed versions of the at least one of the first signal or the second signal.

11 Claims, 7 Drawing Sheets

INTEGRATED CIRCUIT WITH SHMOO DELAY CIRCUIT

CROSS-REFERENCE TO RELATED APPLICATIONS

This application claims the priority under 35 U.S.C. § 119 of India application No. 202311048689, filed on 19 Jul. 2023, the contents of which are incorporated by reference herein.

BACKGROUND

Field

This disclosure relates generally to integrated circuits, and more specifically, to an integrated circuit having shmoo delay circuit.

Related Art

In a typical design, there may be multiple "forking" points at which an asynchronous signal, such as a reset, gets synchronized into a clock domain for synchronous de-assertion. These forking points in a given reset tree may behave wrongly due to being misaligned, during de-assertion, to the destination clock domain or to other synchronized resets. For example, if de-assertion, due to path delays or gate delays, occurs too closely to the active edge of a clock signal, the synchronization flip flops end up in a metastability state in which the outputs may be invalid due to violation of setup times. However, these type of metastability conditions are difficult to detect during the design phase, such as with gate level simulations. Further, when violations are eventually discovered at silicon validation, such as during process-voltage-temperature (PVT) characterization, corrections become extremely costly, typically requiring silicon re-design. These type of metastability conditions may also arise after years of use in the field, at which point there is no way to fix the issues.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, in the development of current systems, it is difficult to detect issues at forking points, such as at clock domain crossings (CDCs) or reset domain crossings (RDCs) within an integrated circuit or system on a chip (SoC). Therefore, a controllable delay scheme is provided which can be used to create conditions of PVT characterizations during the design phase in order to identify metastability conditions, especially at CDCs/RDCs. In one embodiment any pair of asynchronous reset and clock signals or pair of asynchronous reset signals driving converging logic are "shmooed" with respect to each other to expose functional flaws, such as by exciting hidden metastability impacts on functionality where paths driven by these asynchronous resets converge. As used herein, "shmooing" refers to varying the conditions of the input signals, such as, for example, varying their delay, to allow for the determination of acceptable conditions in the circuit. Therefore, as a result of the shmooing of the pair of asynchronous reset and clock signals or pair of reset signals by controlling variable delays, an appropriate (e.g. an optimal) delay condition or setting can be determined and set. The shmooing of the any of the reset or clock signals can be performed by test circuitry on the SoC, including after manufacture, once the SoC is being used in the field, or can be performed by an external tester (e.g. automatic test equipment (ATE)) prior to use in the field.

Figure 1:
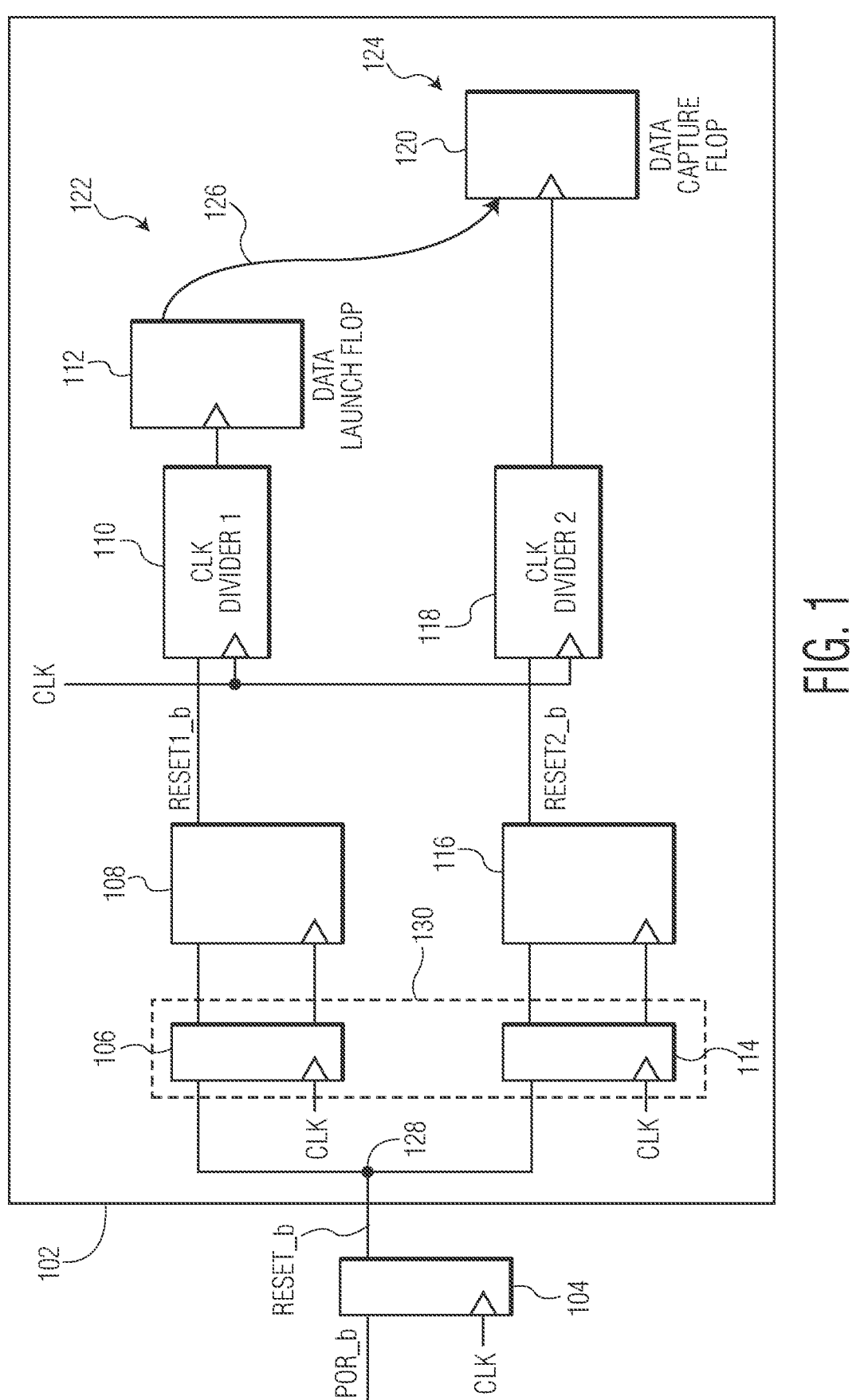
FIG. 1 illustrates, in block diagram form, a real time unit sub system of a system on a chip (SoC) in accordance with one embodiment of the present invention.

FIG. 1 illustrates a real time unit (RTU) subsystem (SS) 102 of an SoC 100, in accordance with one embodiment of the present invention. SoC 100 receives an asynchronous reset signal, such as a power on reset signal (POR_b), and includes a reset synchronizer circuit 104 configured to receive POR_b and synchronize POR_b with a clock (CLK) of SoC 100 to provide a synchronized reset, RESET_b, to RTU SS 102. (As used herein, an "_b" following a signal name indicates an active low signal in which a logic level zero indicates an asserted state and a logic level one indicates a negated or cleared state.) In one embodiment, CLK is also provided to RTU SS 102. RTU SS 102 includes a fork 128 in a circuit path from the output of FF 104, resulting in a first circuit path 122 and a second circuit path 124. Circuit path 122 includes a shmoo circuit 106, a synchronizer circuit 108, a clock divider 110, and a launch flip flop (FF) 112. Circuit path 124 includes a shmoo circuit 114, a synchronizer circuit 116, a clock divider 118, and a capture FF 120, in which an output of FF 112 is coupled to an input of FF 120 via a timing signal path 126 such that, during operation, a value launched (provided) by FF 112 is captured by FF 120. In one embodiment, each of the synchronizer circuits, such as circuits 104, 108, and 116, are implemented as a flip flop (FF), each receiving an asynchronous signal and a clock and configured to synchronize the asynchronous signal to the clock.

Assuming first that paths 122 and 124 do not include shmoo circuits 106 and 114, the RESET_b output of circuit 104 is provided via a first circuit path having a first delay directly to synchronizer circuit 108 and is provided via a second circuit path having a second delay directly to synchronizer circuit 116. Both synchronizer circuits 108 and 116 also receive the common clock CLK and synchronize the received RESET_b to CLK to provide RESET1_b and RESET2_b, respectively. Ideally, RESET1_b and RESET2_b should be the same signal and be phase aligned. However, the first delay of the first circuit path differs, based on its routing, length, etc., from the second delay of the second circuit path, and therefore, RESET1_b and RESET2_b, although both generated from RESET_b, may not have the same clock skew nor be aligned. In the illustrated embodiment, each of RESET1_b and RESET2_b are provided as enable signals to clock dividers 110 and 118, respectively, meaning that the divided clock outputs of the dividers may not be aligned with each other either. This may result in a failure in timing path 126 between FF 112 of path 122 and FF 120 of path 124. While this may be addressed by using a single synchronizer and providing the output to both clk dividers 110 and 118, this may not be a possibility. For example, in one embodiment, paths 122 and 124 may represent two paths of two cores of RSU SS 102 which are in lockstep to each other.

Failures may also occur due to mismatches between an asynchronous signal and a clock signal. For example, if, at a synchronizer circuit (e.g. synchronizer circuit 108 or 116), a change in logic state of the received asynchronous signal (e.g. the received RESET_b) occurs too close to the active edge of the clock (e.g. CLK), then a metastability event may occur in which an output of the synchronizer circuit is invalid due to violation of the FF setup time. This may be the case whether paths 122 and 124 are two lockstep paths or paths 122 and 124 are simply two independent paths in RTU SS 102 (e.g. path 122 may be within a core of RTU SS 102 while path 124 may be a path outside of the core).

Problems with asynchronous signals many times occur at reset tree or clock tree domain crossings (i.e. reset domain crossings (RDCs) or clock domain crossings (CDCs)) of a circuit design. For example, there are typically multiple points in a circuit design where an asynchronous reset gets synchronized into a clock domain for synchronous de-assertion requirements. These points in a particular reset tree may end up wrongly aligned, during de-assertion, to the destination clock domain or to other synchronized resets. As used herein, a reset domain is a portion of circuitry of SoC 100 which receive and use a same (i.e. shared) reset signal, and a clock domain is a portion of circuitry of SoC 100 which receives and uses a same (i.e. shared) clock signal. Failures due to timing in asynchronous signals or clocks at RDCs or CDCs are difficult to detect, and are generally not caught at Register Transfer Level (RTL) verification or with Gate Level Simulation (GLS). Therefore, in one embodiment, such crossings are identified and shmoo delay circuits (also referred to as shmoo circuits or as programmable delay circuits) are inserted into the SoC and used to prevent such failures.

Each shmoo delay circuit is configured to, during test by an ATE or during a self test or calibration period during operation of SoC 100, sweep through the possible combinations of delaying one signal with respect to another signal. For example, in the case of a signal path (e.g. for an asynchronous reset signal) which forks into two, the shmoo delay circuit can be configured to sweep through a set of delays between the asynchronous signal of one forked path and the asynchronous signal on the other forked path to determine an appropriate or optimal delay setting for the forked path. In this example, the delays can be applied to the asynchronous signal of one of the forked paths or the asynchronous signal of the other forked path, or to both. In another example, in the case of an asynchronous signal and a clock signal, the shmoo delay circuit can be configured to sweep through a set of delays between the asynchronous signal and the clock signal to determine an appropriate or optimal delay setting for the synchronization. In this example, the delays can be applied to either the asynchronous signal or the clock or both.

Therefore, in one embodiment, shmoo delay circuits 106 and 114 are inserted in each forked path (e.g. in the first forked path from fork 128 to data path 122 and in the second forked path from fork 128 to data path 124) to receive an asynchronous signal on the corresponding forked path (e.g. RESET_b from FF 104 via fork 128) and the clock (CLK), such that, in each shmoo delay circuit, the received asynchronous signal is shmooed against the clock. In another embodiment, a shmoo delay circuit 130 (which can be represented as the combination of blocks 106 and 114) is inserted in RTU SS 102 between fork 128 and data paths 122 and 124 such that a first asynchronous signal of the forked pair (from fork 128 to data path 122) is shmooed against a second asynchronous signal of the forked pair (from fork 128 to data path 124). As will be described in more detail below, shmooing between a pair of signals (e.g. an asynchronous signal versus another asynchronous signal or a clock) includes sweeping through possible delay combinations of the pair of signals (in which, e.g., each of a set of delays is applied, in turn, to one of the pair of signals).

Figure 2:
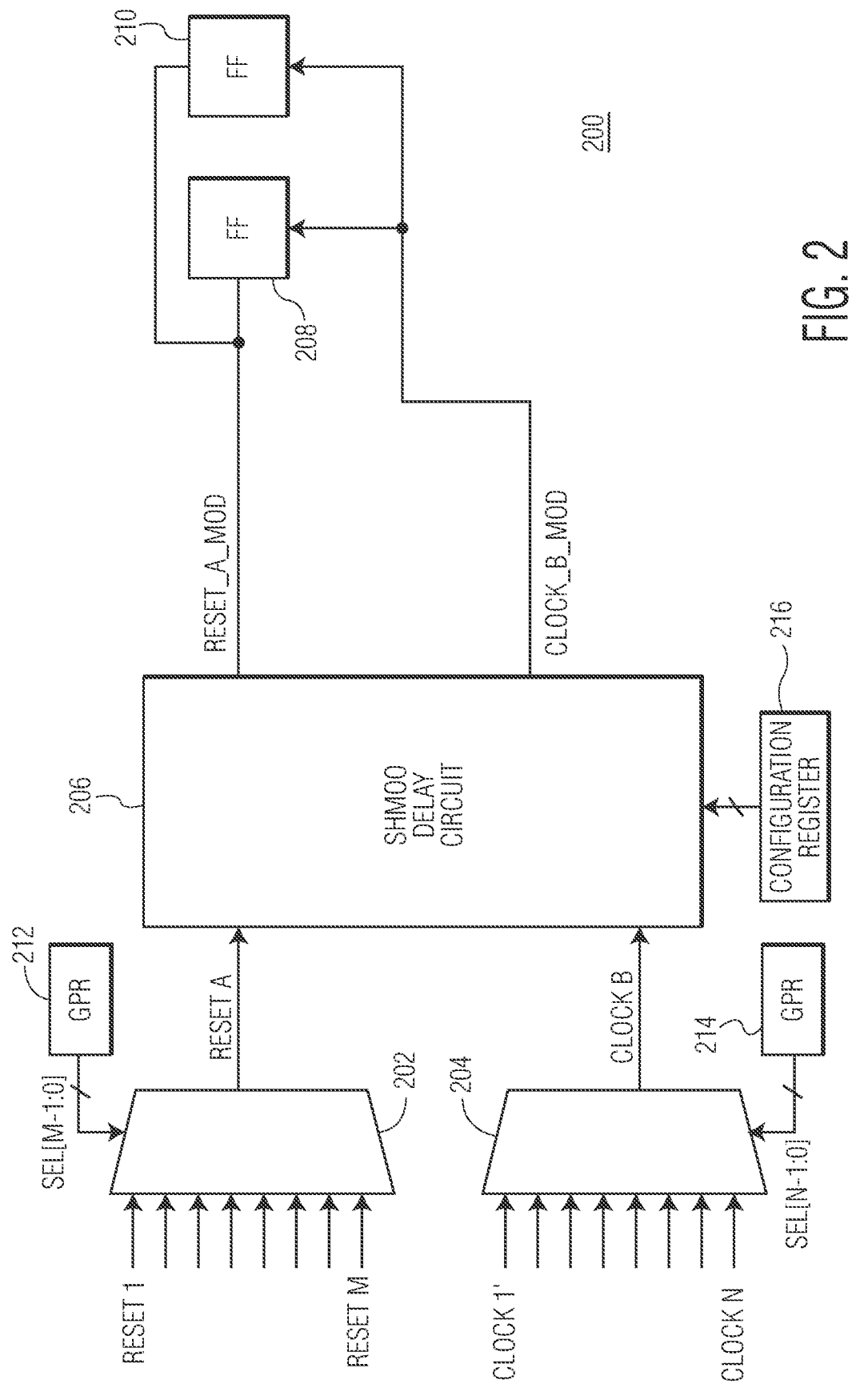
FIG. 2 illustrates, in block diagram form, an SoC having a shmoo delay circuit, in accordance with one embodiment of the present invention.

FIG. 2 illustrates, in block diagram form, an implementation of a portion of an SoC 200 which includes a shmoo delay circuit 206 configured to receive an asynchronous reset signal (RESET A) and a clock signal (CLOCK B) and provide a modified version of RESET A, RESET_A_MOD, and a modified version of CLOCK B, CLOCK_B_MOD. In one embodiment, the modified versions of the input signals correspond to delayed versions of the input signals. RESET A can be any reset signal (e.g. any asynchronous reset signal) received from any of M sources (corresponding to reset signals RESET 1-RESET M), and CLOCK B can be any of N clock signals (CLOCK 1'-CLOCK N). A selector circuit 202 selects one of the input reset signals to provide as RESET A in response to a selection value SEL[M-1:0] received at a corresponding control input, and a selector circuit 204 selects one of the input clock signals to provide as CLOCK B in response to a selection value SEL[N-1:0] received at a corresponding control input. In one embodiment, each of selector circuits 202 and 204 are implemented as multiplexors (MUXes), and the selection values are provided from a general purpose register (GPR) of SoC 200 (e.g. GPR 212 and GPR 214, in which these GPRs can be the same or different GPRs). In FIG. 2, the RESET A reset signal is synchronized with the CLOCK B clock signal by providing the modified reset signal (RESET_A_MOD) to data inputs of FFs 208 and 210, and the modified clocks signal (CLOCK_B_MOD) to the clock inputs of FFs 208 and 210. Shmoo delay circuit 206 is configured to determine the optimal delay (if any) to apply to each of RESET A and CLOCK B to prevent circuit failure (e.g. to prevent a metastability condition). Configuration settings for shmoo circuit 206 can be stored in storage circuitry of SoC 200, such as within a configuration register 216.

Figure 3:
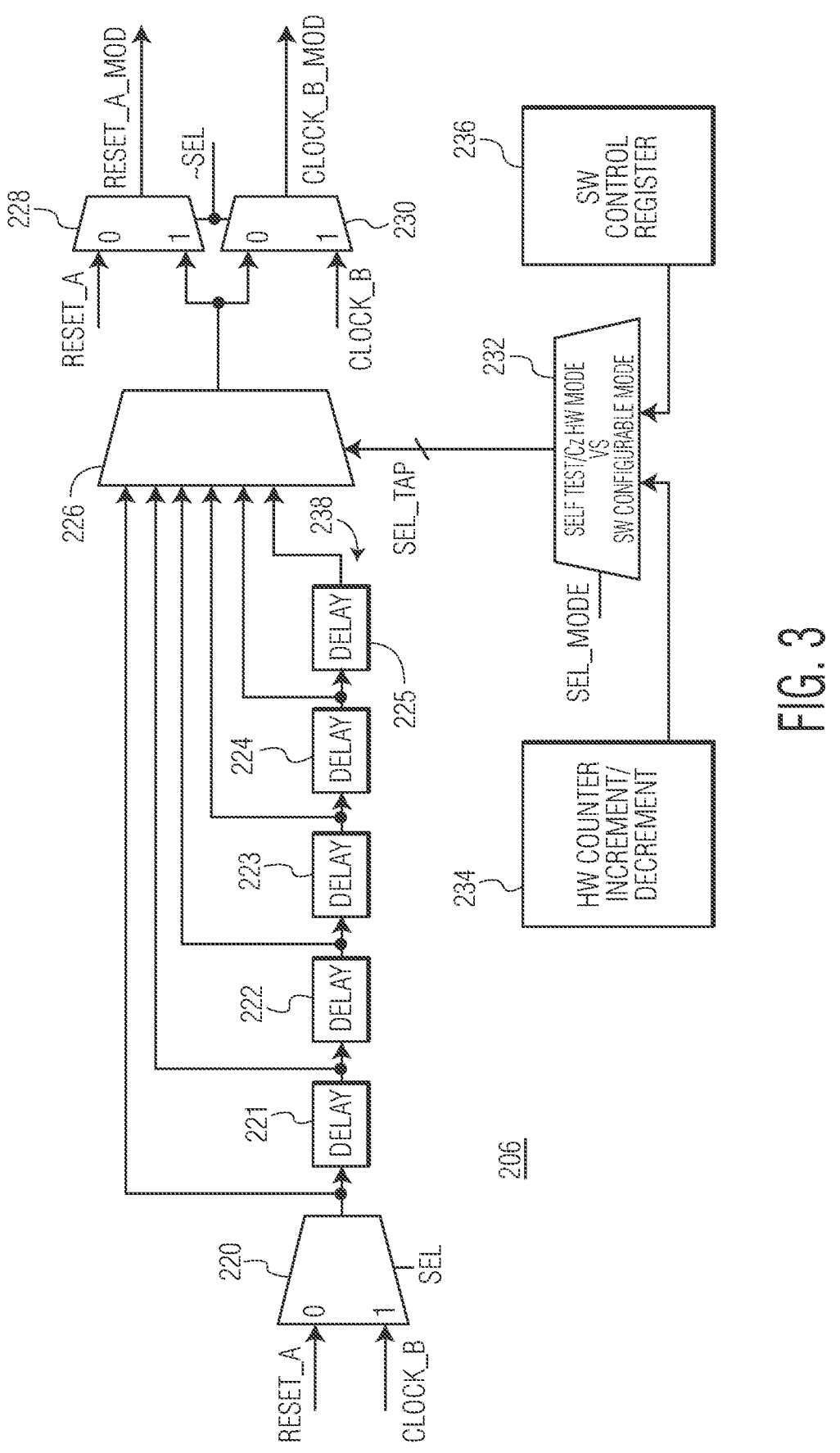
FIG. 3 illustrates, in block diagram form, the shmoo delay circuit of FIG. 2 in further detail, in accordance with one embodiment of the present invention.

FIG. 3 illustrates, in block diagram form, an implementation of shmoo delay circuit 206, in accordance with one embodiment of the present invention. Shmoo delay circuit 206 includes selector circuits 220, 226, 228, 230, and 232, a delay chain 238 including delay elements 221-225, a hardware (HW) counter 234 and a software (SW) control register 236. Each of the selector circuits can be implemented, for example, as MUXes. Selector circuit 220 receives RESET_A at a first input and CLOCK_B at a second input, and provides a selected one of these inputs at an output of selector circuit 220 based on SEL received at a control input. In one embodiment, each delay element of delay chain 238 adds a monotonic delay to the previous signal, such that the output of each delay element 221-225 provides an increasingly delayed output of selector circuit 220 (i.e. provides the output of selector circuit 220 with an increasing delay). The output of selector circuit 220 as well as the outputs of each delay element 221-225 (referred to as delay taps of delay chain 238) are each provided as an input to selector circuit 226, in which one of the delay taps is provided as an output of selector circuit 226 based on a value of SEL_TAP received at a control input of selector circuit 226. (In an alternate embodiment, the output of selector circuit 220 itself is not provided as an input to the selector circuit 226, only the outputs of delay elements 221-225 are provided as inputs.)

Selector circuit 228 receives RESET_A at a first input and the output of selector circuit 226 at a second input, and provides one of these inputs as RESET_A_MOD based on the inverse of SEL (~SEL) at a control input of selector circuit 228. Therefore, RESET_A_MOD may either be RESET A itself or a delayed version of RESET_A, based on ~SEL. Selector circuit 230 receives the output of selector circuit 226 at a first input and CLOCK_B at a second input, and provides one of these inputs as CLOCK_B_MOD based on ~SEL at a control input of selector circuit 230. Therefore, CLOCK_B_MOD may either be CLOCK B itself or a delayed version of CLOCK_B based on SEL. While delay chain 238 is illustrated as having five delay elements to provide five delay taps, delay chain 238 can include any number of delay elements (more or fewer than five), and each delay element may be implemented with any type of circuitry.

In the illustrated embodiment of FIG. 2, shmoo delay circuit 206, during operation, is configured to either delay the reset signal (RESET A) or the clock signal (CLOCK B) using a selected delay tap of delay chain 238. For example, if SEL is negated to a logic level zero, RESET_A is provided at the output of selector circuit 220 to delay chain 238, and selector circuit 226 provides one of the delay taps for RESET_A to selector circuits 228 and 230. With SEL negated to a logic level zero, ~SEL is asserted to a logic level one. In this case, selector circuit 228 provides the output of selector circuit 226 (the delayed version of RESET A) as RESET_A_MOD while selector circuit 230 provides (not delayed) CLOCK_B as CLOCK_B_MOD. If, however, SEL is asserted to a logic level one, CLOCK_B is provided at the output of selector circuit 220 to delay chain 238, and selector circuit 226 provides one of the delay taps for CLOCK_B to selector circuits 228 and 230. In this case, ~SEL is negated to a logic level zero, therefore selector circuit 228 provides (not delayed) RESET_A as RESET_A_MOD and selector circuit 230 provides the output of selector circuit 226 (the delayed version of CLOCK B) as CLOCK_B_MOD.

The delay tap is selected by selector circuit 226 by the value of SEL_TAP, which can be a 3-bit value to select one of the six inputs (but alternately, can include any number of bits to properly select a delay tap). SEL_TAP is provided by a selector circuit 232 which selects whether a self test or characterization is performed in a HW mode or a SW configurable mode (i.e. SW mode) in which the mode is selected with SEL_MODE. That is, selector circuit 232 is used to perform the shmooing of one signal with respect to another, using SEL and SEL_TAP, by sweeping through the set of delay values (e.g. delay taps) to determine an optimal delay setting. This shmooing can be done in HW or in SW, and can be done by an ATE during manufacture or once in the field. During normal operation, however, the selected values of SEL_TAP and SEL for the desired delay settings, determined by the shmooing, can be stored in configuration register 216 so that shmoo delay circuit 206 is configured to operate in accordance with the selected values. In the field, shmooing can be performed, as needed or as desired, in which the settings for shmoo delay circuit 206, stored in configuration register 216, can be updated as needed.

When shmooing is performed for two received signals by shmoo delay circuit 206 to determine a selected or optimal delay setting, either a HW mode or SW mode is used to sweep through different delay values between the two signals. For example, when shmooing is performed by shmoo delay circuit 206, for each of RESET_A and CLOCK_B, a sweep of the delay settings (by selecting delay tap from delay 221 to 225, each in turn) can be performed to determine proper selections which allow for proper circuit operation. Proper circuit operation can be determined, for example, by the ATE or by test circuitry within SoC 200 based on, for example, resulting values in FFs 208 and 210 or in circuitry further downstream, from FFs 208 or 210 or within the test circuitry.

In one embodiment of the shmooing, SEL is first set to a logic level zero in which CLOCK_B is provided as CLOCK_B_MOD while a sweep of the delay taps from delay unit 221-225 is selected, in turn, to apply to RESET_A to generate RESET_A_MOD. Next, SEL is set to a logic level one so that RESET A is provided as RESET_A_MOD while a sweep of the delay taps is selected, in turn, to apply to CLOCK B to generate CLOCK_B_MOD. The results can be stored in table form, representing, for example, a shmoo plot, which identifies which values or range of values (i.e. which delay taps) allow for proper operation of the circuitry receiving RESET_A_MOD and CLOCK_B_MOD. From the identified values or range of values, a desired value (which may be an optimal value) can be selected, and the corresponding configuration values of SEL and SEL_TAP can be stored in configuration register 216. This can be done with an ATE or can be done automatically during periodic or on-demand self tests or characterizations within SoC 200.

In the case of performing a shmoo with the HW mode, SEL_MODE can be set to a logic level zero to select the output of a HW counter 234 to provide as SEL_TAP to selector circuit 226. HW counter 234 can be incremented or decremented to sweep through the values of SEL_TAP to select different delay versions of the output of selector circuit 220 (different delay taps of chain 238). HW counter 234 can be set to increment or decrement with either coarse or fine granularities as the sweeps are performed, in which the sweeps and the value of SEL can be controlled, for example, by firmware or a HW state machine. In the case of performing a shmoo with the SW mode, SEL_MODE can be set to a logic level one to select the output of SW control register 236 to provide as SEL_TAP to selector circuit 226. In this example, SW running on SoC 200 can be used to control the values stored in SW control register 236 and thus control the values of SEL_TAP (and SEL) to sweep through the different delay taps.

Figure 4:
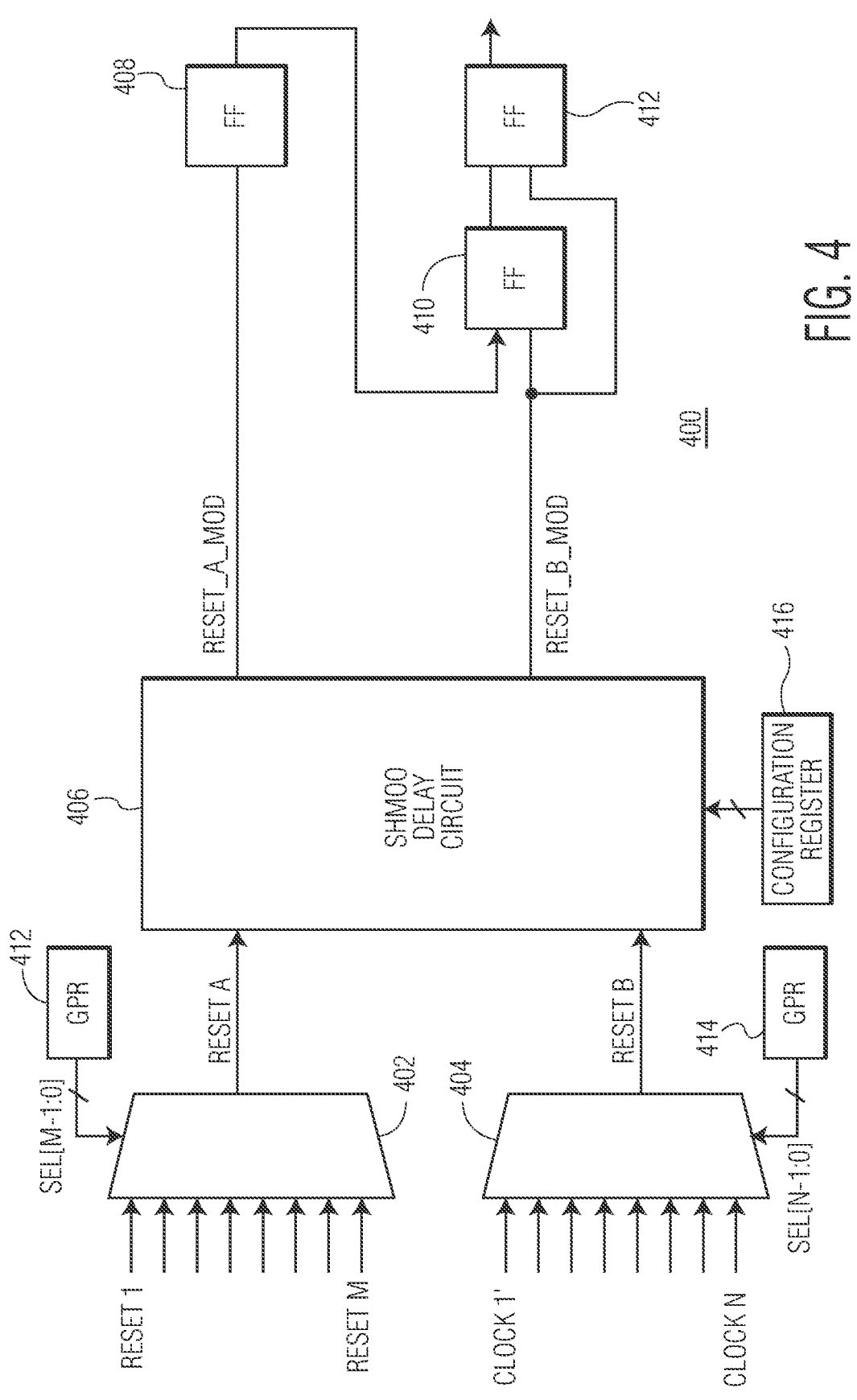
FIG. 4 illustrates, in block diagram form, an SoC having a shmoo delay circuit, in accordance with one embodiment of the present invention.

FIG. 4 illustrates, in block diagram form, an implementation of a portion of an SoC 400 which includes a shmoo delay circuit 406 configured to receive a first asynchronous reset signal (RESET A) and a second asynchronous reset signal (RESET B) and provide a modified version of RESET A, RESET_A_MOD, and a modified version of RESET B, RESET_B_MOD. In one embodiment, the modified versions of the input signals correspond to delayed versions of the input signals. RESET A can be any reset signal (e.g. any asynchronous reset signal) received from any of M sources (corresponding to reset signals RESET 1-RESET M), and RESET B can be any reset signal (e.g. any asynchronous reset signal) received from any of N sources (corresponding to reset signals RESET 1'-RESET N). A selector circuit 402 selects one of the input reset signals to provide as RESET A in response to a selection value SEL[M-1:0] received at a corresponding control input, and a selector circuit 404 selects one of the input clock signals to provide as RESET B in response to a selection value SEL[N-1:0] received at a corresponding control input. In one embodiment, each of selector circuits 402 and 404 are implemented as multiplexors (MUXes), and the selection values are provided from general purpose registers 412 and 414 of SoC 400.

In FIG. 4, the RESET A reset signal which interacts with RESET B in further downstream logic, in which, for example, the first modified reset signal (RESET_A_MOD) is provided to a data input of FF 408, in which the output of FF 408 is provided to FFs 410 and 412 The second modified reset signal (RESET_B_MOD) is also provided to FFs 410 and 412, in which outputs of FFs 410 and 412 depend on both RESET_A_MOD and RESET_B_MOD. In this example, FF 408 can be representative of any logic which operates in response to RESET A, and FFs 410 and 412 can be representative of any logic which operates in response to both RESET B and RESET A (via logic such as FF 408). Shmoo delay circuit 406 is configured to determine the optimal delay (if any) to apply to each of RESET A and RESET B to prevent circuit failure. Configuration settings for shmoo circuit 406 can be stored in storage circuitry of SoC 400, such as within a configuration register 416.

Note that the implementation illustrated in FIG. 2 can be used in the embodiment of FIG. 1, in which shmoo delay circuit 206 can be used as shmoo delay circuit 106 to shmoo RESET_b from FF 104, along the first forked path, with respect to CLK (and another shmoo delay circuit like shmoo delay circuit 206 can be used as shmoo delay circuit 114 to shmoo RESET_b from FF 104, along the second forked path, with respect to CLK). The implementation in FIG. 4 can also be used in the embodiment of FIG. 1, in addition to or in place of shmoo delay circuits such as shmoo delay circuit 206, in which shmoo delay circuit 406 can be used as shmoo delay circuit 130 to shmoo RESET_b from FF 104 along the first forked path with respect to RESET_b from FF 104 along the second forked path. That is, the implementations of FIG. 2 or FIG. 4, or combinations thereof, can be used in any SoC or integrated circuit at RDCs or CDCs or at forking points, such as fork 128.

Figure 5:
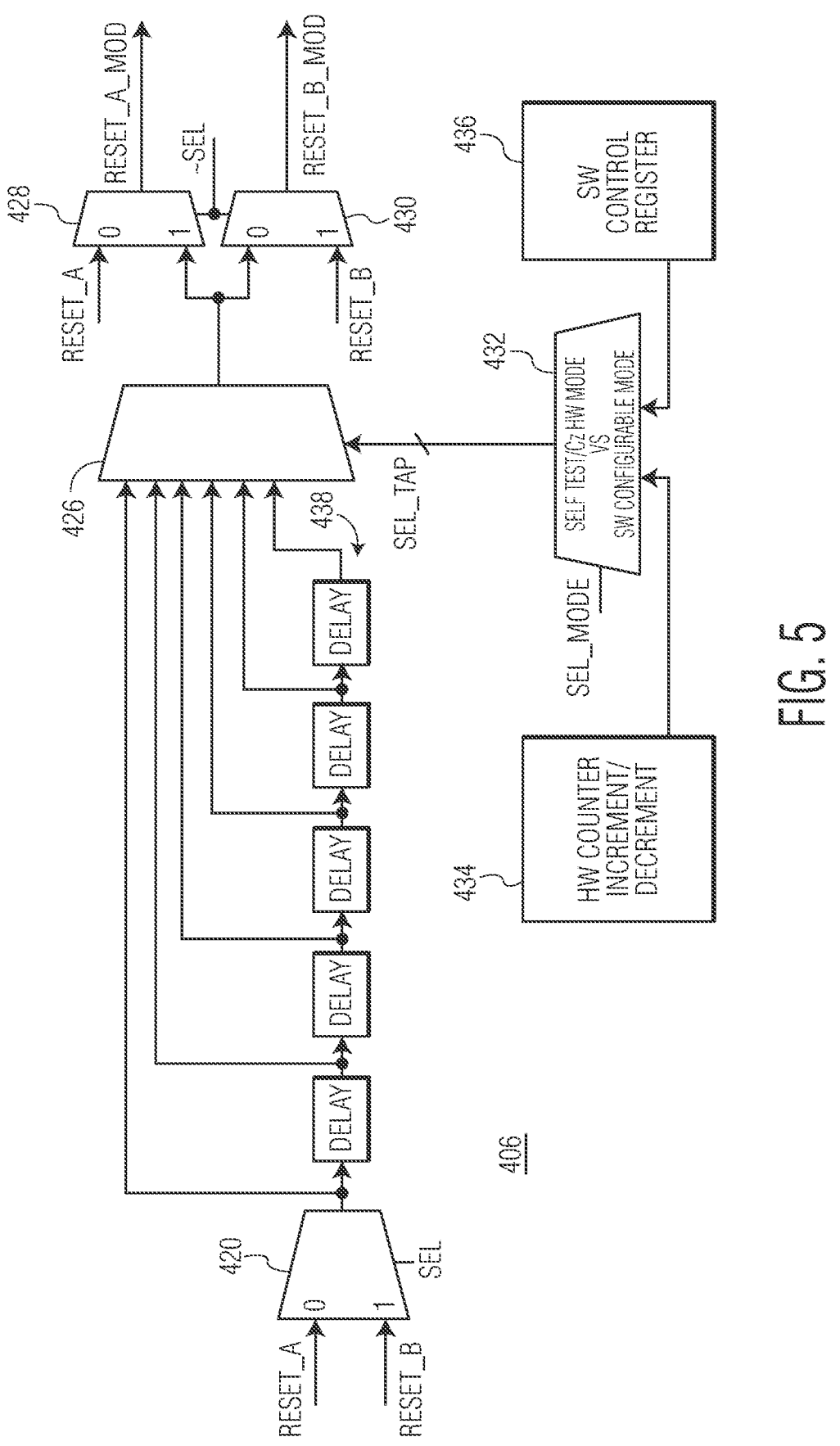
FIG. 5 illustrates, in block diagram form, the shmoo delay circuit of FIG. 4 in further detail, in accordance with one embodiment of the present invention.

FIG. 5 illustrates, in block diagram form, an implementation of shmoo delay circuit 406, in accordance with one embodiment of the present invention. Shmoo delay circuit 406 includes selector circuits 420, 426, 428, 430, and 432, a delay chain 438 including any number of delay elements, a HW counter 434 and a SW control register 436. Each of the selector circuits can be implemented, for example, as MUXes. Shmoo delay circuit 406 is analogous to shmoo delay circuit 206, in which elements 420, 426, 428, 430, 432, 438, 434, and 436 are coupled analogously as and operate analogously to elements 220, 226, 228, 230, 232, 238, 234, and 236, respectively. The difference in shmoo circuit 406 is that shmoo circuit 406 receives RESET A and RESET B to provide RESET_A_MOD and RESEST_B_MOD rather than receiving RESET A and CLOCK B to provide RESET_A_MOD and CLOCK_B_MOD. That is, instead of receiving an asynchronous reset signal and a clock signal as in FIG. 2, the implementation of FIG. 4 receives two asynchronous reset signals. Therefore, CLOCK_B and CLOCK_B_MOD are replaced in FIG. 4 with RESET B and RESET_B_MOD. The select signals SEL (and inverse ~SEL), SEL_TAP, and SEL_MODE also operate as described above in reference to FIG. 2.

In the illustrated embodiment of FIG. 4, shmoo delay circuit 406, during operation, is configured to either delay the first reset signal (RESET A) or the second reset signal (RESET B) using a selected delay tap of delay chain 438. For example, if SEL is negated to a logic level zero, RESET_A is provided at the output of selector circuit 420 to delay chain 438, and selector circuit 426 provides one of the delay taps for RESET_A to selector circuits 428 and 430. With SEL negated to a logic level zero, ~SEL is asserted to a logic level one. In this case, selector circuit 428 provides the output of selector circuit 426 (the delayed version of RESET A) as RESET_A_MOD while selector circuit 430 provides (not delayed) RESET_B as RESET_B_MOD. If, however, SEL is asserted to a logic level one, RESET_B is provided at the output of selector circuit 420 to delay chain 438, and selector circuit 426 provides one of the delay taps for RESET_B to selector circuits 428 and 430. In this case, ~SEL is negated to a logic level zero, therefore selector circuit 428 provides (not delayed) RESET_A as RESET_A-_MOD and selector circuit 430 provides the output of selector circuit 426 (the delayed version of RESET B) as RESET_B_MOD.

Shmooing can be performed, as described above, by sweeping through the values of SEL_TAP for each of RESET_A and RESET_B during a self test or characterization performed in SoC 400 using either a HW mode or SW mode, as described above, or by using an ATE. Therefore, selector circuit 432 is used to perform the shmooing of one reset signal with respect to another reset signal, using SEL and SEL_TAP, by sweeping through the set of delay values (e.g. delay taps) to determine an optimal delay setting. This shmooing can be done in HW or in SW, and can be done by an ATE during manufacture or once in the field. During normal operation, however, the selected values of SEL_TAP and SEL for the desired delay settings, determined by the shmooing, can be stored in configuration register 416 so that shmoo delay circuit 406 is configured to perform in accordance with the selected values. In the field, shmooing can be performed, as needed or as desired, in which the settings for shmoo delay circuit 406, stored in configuration register 416, can be updated as needed.

Note that the descriptions provided above with respect to shmooing for FIG. 2 (including for HW mode and SW mode) also apply to shmooing for FIG. 4. For example, the descriptions of using SEL to select a first signal and then applying delay taps, in turn, to the second signal, followed by using SEL to select the second signal and then applying delay taps, in turn, to the first signal also apply to the implementation of FIG. 4. The results can be used to identify which values or range of values (i.e. which delay taps) allowed for proper operation of the circuitry receiving RESET_A_MOD and RESET_B_MOD. From the identified values or range of values, a desired value (e.g. an optimal value) can be selected, and the corresponding configuration values of SEL and SEL_TAP can be stored in configuration register 416. This can be done with an ATE or can be done automatically during periodic or on-demand self tests or characterizations within SoC 400.

While the embodiments of shmoo delay circuits 206 and 406 illustrate selecting one signal to which to apply a delay with respect to another signal, in alternate embodiments, the shmoo delay circuit can include a delay chain with selectable delay taps for each of the two signals (e.g. for each of RESET A and CLOCK B or for each of RESET A and RESET B). In this case, additional selector circuits, such as selector circuit 226 or 426, would be present, one for each delay chain for each of the two signals. When shmooing the signals with respect to each other, more combinations may be possible with the multiple delay chains. In yet other embodiments, rather than the shmoo delay circuit receiving only two signals to shmoo with respect to each other, additional signals can be received as well (such as an additional reset signal).

Note that the delay chains of FIGS. 2 and 4 may also be referred to as delay generators (or delay generator circuits) and the SEL_TAP signal may also be referred to as a delay selector signal which indicates an amount of delay applied by the delay generator circuit. In alternate embodiments, a delay generator circuit can be implemented using different circuitry, in addition to or in place of a delay chain, in which a delay selector signal (rather than a tap selector) indicates an amount of delay to generate. Also, the delays may not increase or decrease in a linear fashion during shmooing but can instead change with different levels of granularity or in non-linear fashion during shmooing.

Also, in the HW mode, different circuitry may be used, other than or in addition to, a counter for providing the tap select signal or delay selection signal. Therefore, the specific circuit implementations provided in FIGS. 2 and 4 (e.g. the selector circuits and delay generator) are examples, but can be implemented using different circuitry. Further, the circuitry which generates the values of the delay selector signal (e.g. SEL_TAP) may be referred to as shmoo control circuitry. For example, elements 232, 234, and 236 or elements 432, 434, and 436 may be referred to collectively as shmoo control circuitry. The SEL signal may also be referred to as a signal identifier which identifies the signal to which delay from the delay generator is applied.

Figure 6:
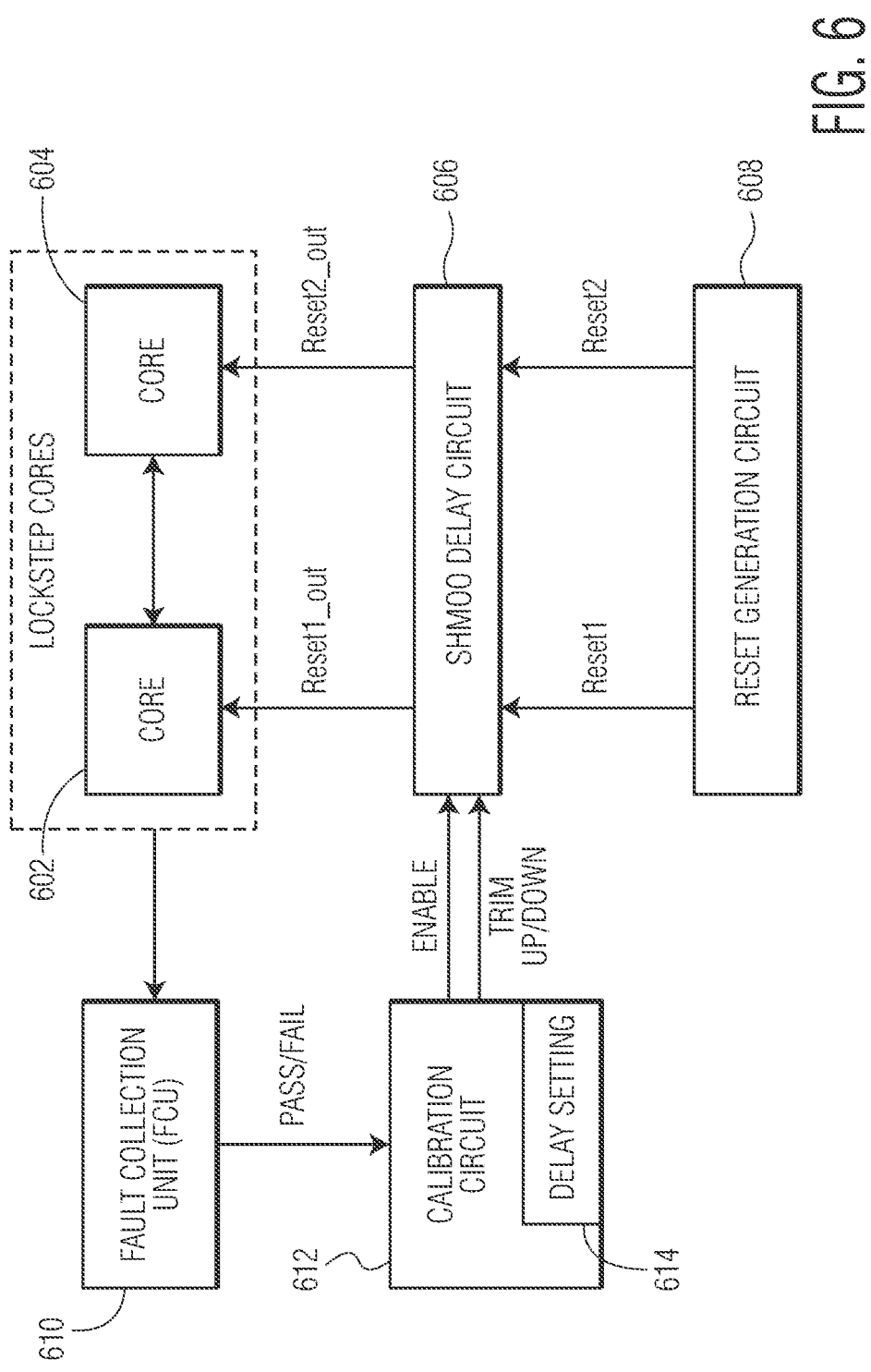
FIG. 6 illustrates, in block diagram form, an SoC having a shmoo delay circuit, in accordance with one embodiment of the present invention.

FIG. 6 illustrates, in block diagram form, an SoC 600 in accordance with one embodiment of the invention which includes a multiple cores (core 602 and core 604), a delay shmoo circuit 606, a reset generation circuit 608 (which may be implemented as a HW module or as a software reset domain), a fault collection unit (FCU) 610, and a calibration circuit 612 including storage circuitry 614 for delay settings (and any other configuration information). Reset generation circuit 608 provides reset signals Reset 1 and Reset 2 to delay shmoo circuit 606, which provides a selectively modified (delayed) version of each reset signal as Reset1_out and Reset2_out, respectively. Shmoo delay circuit 606 may include similar elements and operate analogously to shmoo delay circuit 406 of FIG. 4. In one embodiment, core 602 and core 604 are duplicate cores which operate in lockstep with each other (and may therefore be referred to as lockstep cores). FCU 610 receives information from the lockstep cores and determines pass or fail conditions for different faults and provides this information to calibration circuit 612. In one embodiment, the circuitry of FCU 610 and calibration 612 may be referred to as test circuitry or self test circuitry.

Figure 7:
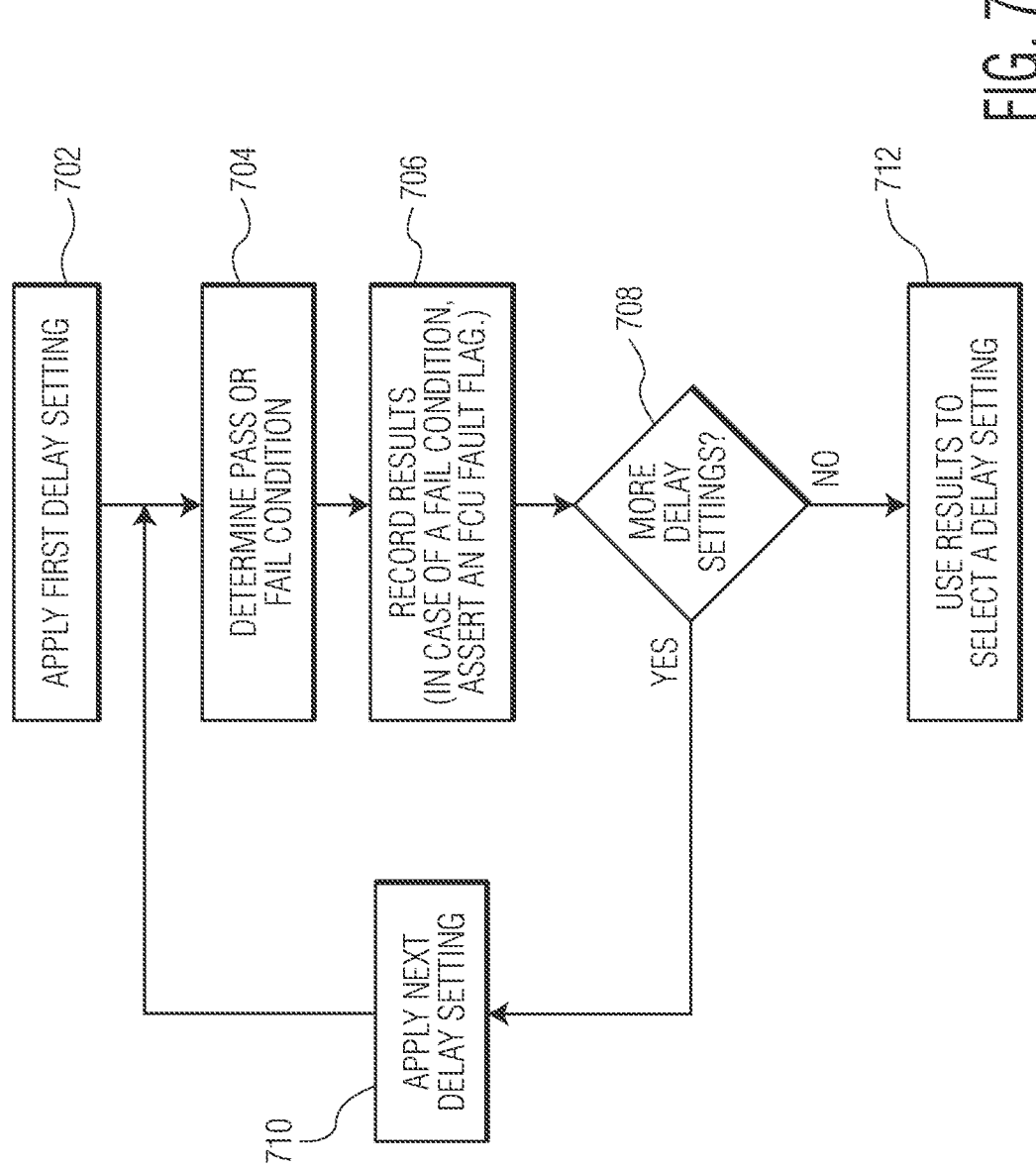
FIG. 7 illustrates, in block diagram form, a shmooing method performed in the SoC of FIG. 6, in accordance with one embodiment of the present invention.

Operation of FIG. 6 will be described in more detail with respect to a shmooing method 700 illustrated with the flow diagram of FIG. 7. Method 700 begins with block 702 in which a first delay setting (e.g. the delay setting resulting in the least delay between Reset1_out and Reset2_out) is applied to shmoo delay circuit 606 as the current delay setting. The current delay setting may include, for example, settings for SEL (to select which of Reset1 and Reset2 is to be delayed) and SEL_TAP (to select a delay tap to be applied to the selected one of Reset1 and Reset2). A test is performed with the current delay setting (e.g. as enabled by the enable signal from calibration circuit 612 to shmoo delay circuit 606) in which the contents of logic within core 602 or 604 is provided to FCU 610 to determine if the logic has the expected values (to determine whether the test passed or failed). Therefore, at block 704, FCU 610 determines if the current delay setting results in a pass or fail condition. For example, as illustrated in FIG. 4, the contents of FF 412 or 418 or both may be monitored by FCU 610 to determine whether the reset signals, with the selected delay, result in the expected operation of FF 410 or FF 412. Therefore, the tested logic of cores 602 and 604 may correspond to a portion of logic which is driven by both Reset1_out and Reset2_out, similar to FFS 410 and 418 which are driven by both RESET_A_MOD and RESET_B_MOD. In one embodiment, the lockstep cores 602 and 604 are monitored for activity on the data bus for correlation in which any mismatch indicates a misalignment of the resets, resulting in a fault indication to FCU 610.

At block 706, the result of the test at the current delay setting is stored or recorded within calibration circuitry 612. In the case of a fail, an FCU fault flag can be asserted. Next, at decision diamond 708, it is determined if there are any additional delay settings to try for the sweep. If so, method 700 proceeds to block 710 in which a next delay setting (e.g. the delay setting with an increased delay as compared to the current delay setting) is applied to shmoo delay circuit 606 via the trim up/down signals from calibration circuit 612 to shmoo delay circuit 606. For example, a HW counter (in a HW mode) may be incremented or contents of a SW configuration register may be updated (in a SW mode). After block 710, method 700 returns to block 704. When there are no more delay settings to apply for the sweep, method 700 proceeds from decision diamond 708 to block 712, in which the shmooing is complete and a delay setting which resulted in a pass may be selected from the stored settings. This selected delay setting may correspond, for example, to a most optimal delay setting in comparison with other delay settings which passed. In an alternate embodiment, only those delay settings which passed are stored in which, in the case of a fail, the settings are not stored. Therefore, shmooing method 700 performs a shmoo of Reset1 with respect to Reset2 (by, e.g., sweeping through the available delay settings) to select a desired (e.g. optimal) delay setting for shmoo delay circuit 606, which can be stored as delay setting 614 in calibration circuit 612. The stored delay setting 614 can therefore be used by shmoo delay circuit 606 during normal operation for improved circuit operation (in which timing faults are prevented).

Therefore, by now there has been provided a shmoo delay circuit which may be configured in such a way as to prevent timing faults during circuit operation. The shmoo delay circuit can be operated, as needed, to shmoo one asynchronous signal with respect to a clock or to another asynchronous signal to determine an optimal delay setting which prevents circuit faults due to respecting timing of the signals. In one embodiment, each shmoo delay circuit includes a delay generator, such as a delay chain, which delays one signal with respect to another. In this manner, the shmoo delay circuit is configured to shmoo one signal with respect to another by applying each delay of a set of delays to one or more of the signals in order to determine the desired delay setting. This can be performed, for example, under different conditions or at different PVT settings, after silicon manufacture or while in the field, to provide improved circuit operation.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "_b" or an asterisk (*) following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIGS. 1, 2, 4, and 6 and the discussions thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of FIGS. 1, 2, 4, and 6 can be circuitry located on a single integrated circuit or within a same device (e.g. an SoC). Alternatively, they may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of the SoC, for example, from computer readable media. Such computer readable media may be permanently, removably or remotely coupled to an information processing system such as SoC 100, 200, 400, or 600. The computer readable media may include, for example and without limitation, any number of the following: nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Although the invention is described herein with reference to specific embodiments, various modifications and changes can be made without departing from the scope of the present invention as set forth in the claims below. For example, each shmoo delay circuit can generate delayed versions of any of the received signals using any delay generator circuitry, in addition to or in place of a delay chain. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, an integrated circuit includes a first circuit path configured to communicate a first signal, wherein the first signal is an asynchronous signal; a second circuit path configured to communicate a second signal; a shmoo delay circuit configured to receive the first and second signals and having shmoo control circuitry and a delay generator configured to receive a delay selector signal from the shmoo control circuitry indicative of an amount of delay, the shmoo delay circuit configured to provide a delayed version of at least one of the first signal or the second signal; a first logic circuit configured to receive the delayed version of the at least one of the first signal or the second signal; and a second logic circuit configured to receive another one of the first signal or the second signal, wherein the shmoo control circuitry is configured to modify the delay selector signal to sweep through a set of different delay amounts applied by the delay generator to generate delayed versions of the at least one of the first signal or the second signal. In one aspect of the embodiment, the integrated circuit further includes storage circuitry configured to store a selected setting for the delay selector signal corresponding to a selected amount of delay selected as a result of the sweep. In a further aspect, the storage circuitry is configured to further store an identifier of the at least one of the first signal or the second signal. In another further aspect, during normal operation, the shmoo delay circuit is configured to provide the delayed version of the at least one of the first signal or the second signal in accordance with the stored selected setting. In another aspect of the above embodiment, the second signal is a clock signal, and the first and second logic circuits form a synchronization circuit configured to synchronize the first signal to the clock signal. In a further aspect, the shmoo delay circuit is configured to provide a delayed version of the first signal and a non-delayed version of the clock signal. In another further aspect, the shmoo delay circuit is configured to provide a delayed version of the clock signal and a non-delayed version of the first signal. In another aspect of the above embodiment, the first signal is a first asynchronous reset signal and the second signal is a second asynchronous reset signal, wherein an output of the second logic circuit is provided in response to the second asynchronous signal and an output of the first logic circuit. In a further aspect, each of the first and second asynchronous signals are provided from a circuit forking point of the integrated circuit which splits into the first circuit path and the second circuit path. In yet a further aspect, the second circuit path operates in lockstep with the first circuit path. In yet a further aspect, the integrated circuit further includes a first core and a second core in lockstep with the first core, wherein the first core includes the first circuit path and the second core includes the second circuit path. In another aspect of the above embodiment, the delay generator includes a delay chain, wherein an output of each delay circuit of the delay chain corresponds to a delay tap of the delay chain, wherein the delay selector signal is configured to indicate a selected delay tap of the delay chain. In a further aspect, the shmoo control circuitry is configured to sweep through the set of different delay amounts applied by the delay generator to generate the delayed versions of the at least one of the first signal or the second signal by selecting, in turn, each delay tap of the delay chain.

In another embodiment, an integrated circuit includes a first circuit path configured to communicate a first asynchronous reset signal; a second circuit path configured to communicate a second asynchronous signal; a shmoo delay circuit configured to receive the first and second signals and having shmoo control circuitry and a delay generator configured to receive a delay selector signal from the shmoo control circuitry indicative of an amount of delay, the shmoo delay circuit configured to provide a delayed version of at least one of the first asynchronous reset signal or the second asynchronous reset signal; a logic circuit configured to receive the delayed version of the at least one of the first signal or the second signal and configured to generate an output based on both the first asynchronous reset signal and the second asynchronous reset signal, wherein the shmoo control circuitry is configured to modify the delay selector signal to sweep through a set of different delay amounts applied by the delay generator to generate delayed versions of the at least one of the first signal or the second signal; and testing circuitry configured to store a selected setting for the delay selector signal corresponding to a selected amount of delay selected as a result of the sweep. In one aspect of the another embodiment, the testing circuitry is further configured to store an identifier of the at least one of the first asynchronous reset signal or the second asynchronous reset signal. In another aspect, during normal operation, the shmoo delay circuit is configured to provide the delayed version of the at least one of the first signal or the second signal in accordance with the stored selected setting. In yet another aspect, the delay generator includes a delay chain, wherein an output of each delay circuit of the delay chain corresponds to a delay tap of the delay chain, wherein the delay selector signal is configured to indicate a selected delay tap of the delay chain. In a further aspect, each of the first and second asynchronous reset signals are provided from a circuit forking point of the integrated circuit which forks into the first circuit path and the second circuit path. In yet a further aspect, the second circuit path operates in lockstep with the first circuit path. In another aspect of the another embodiment, the testing circuitry is configured to, during the sweep through the set of different delay amounts applied by the delay generator, for each delay amount, determine whether the logic circuit indicates a pass or fail condition, wherein the selected setting for the delay selector signal corresponds to an optimal delay amount which results in a pass condition.

What is claimed is:

1. An integrated circuit, comprising:
   a first circuit path configured to communicate a first signal, wherein the first signal is an asynchronous signal;
   a second circuit path configured to communicate a second signal;
   a shmoo delay circuit configured to receive the first and second signals and having shmoo control circuitry and a delay generator configured to receive a delay selector signal from the shmoo control circuitry indicative of an amount of delay, the shmoo delay circuit configured to provide a delayed version of at least one of the first signal or the second signal;
   a first logic circuit configured to receive the delayed version of the at least one of the first signal or the second signal; and
   a second logic circuit configured to receive another one of the first signal or the second signal, wherein the shmoo control circuitry is configured to modify the delay selector signal to sweep through a set of different delay amounts applied by the delay generator to generate delayed versions of the at least one of the first signal or the second signal,
   wherein the first signal is a first asynchronous reset signal and the second signal is a second asynchronous reset signal, wherein an output of the second logic circuit is provided in response to the second asynchronous signal and an output of the first logic circuit, and wherein each of the first and second asynchronous signals are provided from a circuit forking point of the integrated circuit which splits into the first circuit path and the second circuit path.

2. The integrated circuit of claim 1, further comprising storage circuitry configured to store a selected setting for the delay selector signal corresponding to a selected amount of delay selected as a result of the sweep.

3. The integrated circuit of claim 2, wherein the storage circuitry is configured to further store an identifier of the at least one of the first signal or the second signal.

4. The integrated circuit of claim 2, wherein, during normal operation, the shmoo delay circuit is configured to provide the delayed version of the at least one of the first signal or the second signal in accordance with the stored selected setting.

5. The integrated circuit of claim 1, wherein the second circuit path operates in lockstep with the first circuit path.

6. The integrated circuit of claim 5, further comprising a first core and a second core in lockstep with the first core, wherein the first core comprises the first circuit path and the second core comprises the second circuit path.

7. The integrated circuit of claim 1, wherein the delay generator comprises a delay chain, wherein an output of each delay circuit of the delay chain corresponds to a delay tap of the delay chain, wherein the delay selector signal is configured to indicate a selected delay tap of the delay chain.

8. The integrated circuit of claim 7, wherein the shmoo control circuitry is configured to sweep through the set of different delay amounts applied by the delay generator to generate the delayed versions of the at least one of the first signal or the second signal by selecting, in turn, each delay tap of the delay chain.

9. The integrated circuit of claim 1, further comprising:
   testing circuitry configured to store a selected setting for the delay selector signal corresponding to a selected amount of delay selected as a result of the sweep.

10. The integrated circuit of claim 9, wherein the testing circuitry is further configured to store an identifier of the at least one of the first signal or the second signal.

11. The integrated circuit of claim 9, wherein the testing circuitry is configured to, during the sweep through the set of different delay amounts applied by the delay generator, for each delay amount, determine whether the first and second logic circuits indicate a pass or fail condition, wherein the selected setting for the delay selector signal corresponds to an optimal delay amount which results in a pass condition.

\* \* \* \* \*